(12) United States Patent
Metzger et al.

(10) Patent No.: US 7,489,067 B2
(45) Date of Patent: Feb. 10, 2009

(54) COMPONENT WITH A PIEZOELECTRIC FUNCTIONAL LAYER

(75) Inventors: Thomas Metzger, Munich (DE); Christian Diekmann, Bad Heilbrunn (DE); Edgar Schmidhammer, Stein (DE)

(73) Assignee: EPCOS AG, Munich (DE)

( * ) Notice: Subject to any disclaimer, the term of this patent is extended or adjusted under 35 U.S.C. 154(b) by 315 days.

(21) Appl. No.: 10/552,927

(22) PCT Filed: Feb. 6, 2004

(86) PCT No.: PCT/EP2004/001122

§ 371 (c)(1),
(2), (4) Date: Oct. 11, 2005

(87) PCT Pub. No.: WO2004/091098

PCT Pub. Date: Oct. 21, 2004

(65) Prior Publication Data

US 2007/0103037 A1    May 10, 2007

(30) Foreign Application Priority Data

Apr. 11, 2003  (DE) ................................ 103 16 716

(51) Int. Cl.
*H01L 41/08* (2006.01)

(52) U.S. Cl. ..................... 310/358; 310/364

(58) Field of Classification Search ......... 310/320–322, 310/324, 344, 364
See application file for complete search history.

(56) References Cited

U.S. PATENT DOCUMENTS

| | | | |
|---|---|---|---|
| 4,433,264 A | 2/1984 | Nishiyama et al. | |
| 4,445,066 A * | 4/1984 | Nishiyama et al. | 310/364 |
| 5,587,620 A | 12/1996 | Ruby et al. | |
| 5,760,663 A | 6/1998 | Pradal | |
| 6,291,931 B1 | 9/2001 | Lakin | |
| 6,411,017 B1 * | 6/2002 | Qiu et al. | 310/358 |
| 6,548,942 B1 * | 4/2003 | Panasik | 310/364 |
| 6,882,089 B2 * | 4/2005 | Kashiwaya et al. | 310/358 |
| 6,906,451 B2 * | 6/2005 | Yamada et al. | 310/324 |
| 7,148,610 B2 * | 12/2006 | Jacot et al. | 310/364 |
| 7,276,836 B2 * | 10/2007 | Umeda et al. | 310/320 |
| 7,323,805 B2 * | 1/2008 | Sano et al. | 310/358 |

FOREIGN PATENT DOCUMENTS

| | | |
|---|---|---|
| EP | 1 124 328 | 8/2001 |
| EP | 1 326 332 | 9/2003 |
| WO | WO02/23720 | 3/2002 |

\* cited by examiner

*Primary Examiner*—Mark Budd
(74) *Attorney, Agent, or Firm*—Fish & Richardson P.C.

(57) ABSTRACT

An electrical component includes a substrate, a first electrode layer, a structured growth layer that is thinner than the first electrode layer, a piezoelectric layer, and a second electrode layer. The growth layer is on the first electrode layer, the growth layer is structured relative to the first electrode layer, and the growth layer has a smaller surface area than the first electrode layer. The growth layer may be selected to support ordered growth relative to the piezoelectric layer.

16 Claims, 2 Drawing Sheets

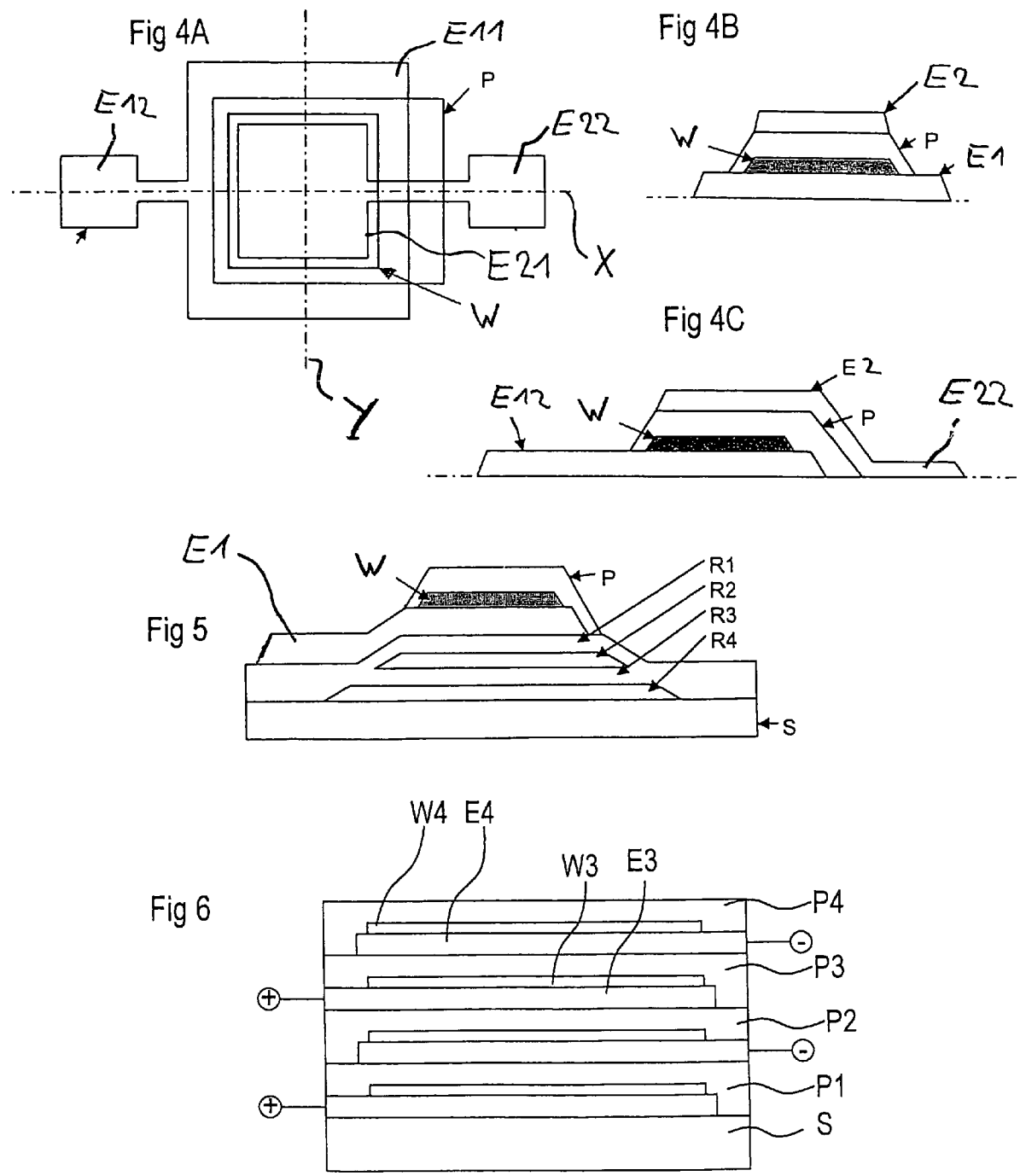

COMPONENT WITH A PIEZOELECTRIC FUNCTIONAL LAYER

TECHNICAL FIELD

Resonators that work with bulk acoustic waves, so-called FBAR (thin film bulk acoustic resonators) or also called BAW resonators (bulk acoustic wave resonators), are based on a piezoelectric base body that is embodied as a thin film and that is provided with an electrode on each of two main surfaces. Such resonators can be used to construct HF filters. A plurality of such resonators are wired in branched circuits in a component embodied as a filter.

BACKGROUND

Components based on BAW resonators play a role in particular as filters in end devices for mobile telecommunications.

Components with BAW resonators are generally constructed on a carrier substrate, e.g., a crystal wafer. Arranged between each resonator and the carrier substrate is either a recess that is filled with air, and that represents a high increase in impedance acting highly reflectively on the acoustic wave, or an acoustic mirror. In each case, this is how the acoustic wave is prevented from exiting the resonator in the direction of the carrier substrate TS.

An acoustic mirror comprises, e.g., an alternating sequence of layers with high and low acoustic impedance. The thickness of each of the mirror layers is approximately ¼ of the wavelength of the acoustic wave in the given material. A first acoustic mirror arranged under the resonator comprises an alternating sequence of layers with high and low acoustic impedance.

During production of a BAW resonator, as a rule the layers are produced on the component on top of one another, but each is produced separately from the other and when needed structured individually. The method for depositing and structuring the layers becomes more complex as the number of layers increases. For instance, errors in the deposition of the correct thickness for each layer can accumulate so that there is a significant scattering of the resonance frequencies of the resonators over the entire wafer and thus there is a significant scattering of the mid-frequency of filters.

In addition to the aforesaid BAW resonators, other components working with thin piezoelectric layers as functional layers are known, in particular thin film sensors and piezoelectric actuators. In the case of these components, as well, they are generally applied to carrier substrates and include a multilayer structure made of at least a first electrode, the piezoelectric functional layer, and a second electrode. Especially in the case of the piezoelectric actuators, multilayer structures are required in which the layer sequence of piezoelectric functional layer and electrode layer is repeated several times. In all components with a piezoelectric functional layer, the quality of the component is largely determined by the quality of the piezoelectric layer.

Realizing BAW resonators with low losses and a high piezoelectric coupling coefficient requires the strictly ordered orientation of the individual crystallites within the piezoelectric layer, which is only possible using a suitable deposition method, as a rule the PVD method, and on a suitable base. For BAW resonators, optimum electrical properties can be attained when the thin film grows such that within each crystallite of the thin film a preferred crystallographic direction is in a clear geometric relationship to a direction of the substrate. For instance, it is advantageous when the piezoelectric main axis is oriented strictly parallel to the normal on the substrate surface and the crystallites consequently grow strictly parallel to one another.

In addition to the deposition parameters, which are to be adjusted appropriately, this can in particular be attained using the selection of a suitable growth layer on which the crystallites of the piezoelectric layer can grow in an ordered manner. For this, in known components the piezoelectric layers are deposited on an electrode layer that also assumes the function of the growth layer. However, it is disadvantageous that the selection of suitable materials that offer both adequate electrode properties and also good conditions for ordered growth of the piezoelectric layer is very limited. The only materials that are available require compromises in terms of the electrode properties and the properties that support the growth of the piezoelectric layer.

SUMMARY

This application describes a component constructed on a substrate as a sequence of individual layers normally deposited as thin film and includes at least a first electrode layer, a structured growth layer that is thin relative to the first electrode layer, a piezoelectric (functional) layer, and a second electrode layer.

The application describes a component with a piezoelectric functional layer in which the piezoelectric functional layer is highly ordered and in which an electrode layer with optimum electrode properties can still be selected. This is accomplished by decoupling the electrode function and the growth-supporting function in the form of two separate layers. Thus, the growth layer and electrode layer can be optimized independent of one another, whereby a component with an improved electrode layer and a simultaneously improved piezoelectric layer is obtained, and thus improved electrical properties are obtained overall, which in the past has not been attainable simultaneously overall.

The component is constructed on a substrate that is the carrier for the successive layers of the component that are deposited upon one another. It is possible to provide between the substrate and first electrode layer one or a plurality of additional layers with a similar or different function. The substrate can be selected solely as a carrier layer with respect to adequate mechanical strength. It is also possible to use a semi-conductor substrate in order to facilitate the integration of electrical or electronic components into the substrate.

The first electrode layer can be a single uniform layer or can be realized as a multi-layer structure with at least two different layers. The electrode layer satisfies the electrode functionality and is therefore sufficiently conductive. Preferably the electrode layer, i.e., its surface, is embodied such that it is simple to apply electrical connecting elements. Bonding wires, bumps, or film electrodes can be provided as connecting elements. It is also advantageous when the electrode layer has a high power rating. Such a layer is advantageously attained with layers made of metals from the platinum group (Pt, Os, Ir, Pd, Ru, Rh), Ag, Au, and/or Cu or with multilayer structures that contain such individual layers. Aluminum and layer systems that contain aluminum are also advantageous, for instance AlCu, AlSiCu, AlMg, or Al alloys, or also ceramic electrode systems, e.g., titanium nitride. Layers or multilayer structures based on aluminum are also advantageous in particular when they are used in resonators that work with bulk acoustic waves because, due to how thin such layers or multilayer structures are, inhomogeneities in layer thickness as seen across the entire substrate lead only to moderate scattering in the resonance frequency of the resonators.

Applied over the electrode layer is a growth layer that is thin relative thereto and that facilitates the ordered, textured, and crystal-axis oriented growth of a piezoelectric layer. Materials and/or layers are already known; however, it has not been possible to use these in the past as optimum electrode materials due to disadvantages associated with them. It is the separation of electrode function and growth function that makes it possible to use optimized growth layers independent of the electrode layer.

Molybdenum and gold layers have proved themselves as growth layers, for instance. Further suitable are also metal layers made of tungsten or platinum, as well as a number of oxide or semi-conducting compounds, such as silicon which support crystal-axis oriented growth of piezoelectric layers. Growth layers can therefore also comprise, for instance, sapphire, spinel, barium titanate, zircon oxide, magnesium oxide, or titanium oxide.

The selection of the growth layer depends on the type of piezoelectric layer to be grown. Certain material combinations are particularly preferred. If for instance an aluminum nitride layer is used as the piezoelectric layer, molybdenum has proved to be a preferred material for the growth layer. Both gold and molybdenum are particularly suitable for a piezoelectric layer made of zinc oxide.

In addition to the material selection, modifying the growth layer can also be important. For instance with growth layers made of gold it was possible to observe results that were very different from one another during growth of the piezoelectric layer depending on the nature of the gold. For instance vapor-deposited gold is particularly preferred for the growth layer.

The piezoelectric layer is grown directly over the growth layer. It can include any desired piezoelectric material that permits crystal-axis oriented growth. The materials zinc oxide and aluminum nitride are also preferred since they have already proven themselves in components as piezoelectric functional layers.

A second electrode layer is provided over the piezoelectric layer. For producing a corresponding multilayer component, the second electrode layer can also be provided with a growth layer and thereover with another piezoelectric layer and finally with another electrode, whereby this structure can also be repeated several times. In addition, primer layers or adapting layers can also be provided between electrode layer and growth layer.

In one embodiment, the growth layer is structured such that it has a smaller surface area than the electrode region provided directly in the electrode layer. The structuring can be performed for instance using a lift-off method that makes it possible to avoid the use of complex plasma processes such as for instance dry etching and the associated (radiation) damages. These would require complex post-treatments using dry or wet methods that would complicate the method as additional process steps. Wet-etchable layers can be structured with no problem or risk after the growth layer has been deposited without this having a negative impact on the surfaces and the additional growth of layers thereunder.

The piezoelectric layer is preferably grown for the entire surface area, whereby it is ordered at least in the region over the growth layer and in particular grows in a manner oriented to the crystal-axis. Around the growth layer, the piezoelectric layer encloses with the electrode layer and/or its electrode region. Now it is also possible to structure the piezoelectric layer after deposition, whereby the structure limits are drawn such that the complete encapsulation of the growth layer between piezoelectric layer and electrode layer or between piezoelectric layer and electrode region is maintained. For the component, this has the additional advantage that there are no boundary surface problems or incompatibilities with the second electrode layer. Such incompatibilities, which on boundary surfaces of certain layer systems lead to material migration, would otherwise require additional barrier layers made of e.g. Ti or Pt in order to avoid direct contact between these electrode and growth layer materials that are incompatible with one another.

An additional advantage of the complete encapsulation of the growth layer is that now materials can be used that are actually not permitted as an exposed layer in further processing stages of components. In particular, when components are constructed on semi-conductor substrates and combined with CMOS processes, the use of various materials must be excluded for avoiding contamination. With the encapsulation of the growth layer, this is not necessary in terms of the growth layer and therefore it is possible to use materials that might otherwise not be considered because of this.

The embedding of the growth layer and/or the structuring of the growth layer and of the piezoelectric layer relative thereto also has the additional advantage that the structuring of the piezoelectric layer can occur selectively relative to the first electrode layer or selectively only to the uppermost layer of the multilayer structure used for the first electrode layer. Simultaneous structuring of a plurality of layers is therefore not necessary. Therefore, it is also possible to undertake wet-chemical structuring of the piezoelectric layer, which otherwise (when etching multilayer systems) could lead to under-etching. For this reason, as well, the otherwise damaging use of dry etching processes, which also involve greater costs, can be avoided.

For the selection of the growth layer, it is irrelevant whether the material used for this has adequate electrode properties and in particular current carrying capacity or whether the method used provides adequate edge covering. Electrical conductivity is not required at all, depending on the layer thickness used. Thus, poor electrical conductors can be used, as can deposition methods in which it is not possible or is very difficult to attain adequate edge covering.

Advantageously, metals or multilayer systems with a high power tolerance can be used for the second electrode layer or for an electrode multilayer system that is used as the second electrode layer. In this case, as well, layers or multilayer systems can be used that have individual layers made of metals from the platinum group, silver, gold, copper, titanium, molybdenum, and tungsten, as well as aluminum layer systems or layer system that include aluminum such as for instance AlCu, AlSiCu, AlMg. Just as suitable are ceramic electrode systems such as for instance titanium nitride.

Not only is a component with a piezoelectric layer with improved interior structure obtained, but the method for production is also improved such that a stable and capable process can be conducted (process capacity index (centered) >1.33). The method is suitable for integration in CMOS methods. Therefore the components with a piezoelectric (functional) layer and with electric and electronic components integrated in the substrate can be produced simultaneously in the process line.

Embodiments are described below in greater detail using the associated schematic figures, which are for explanatory purposes and are therefore not to scale.

DESCRIPTION OF THE DRAWINGS

FIG. 4 is a top view and two sections of a possible structuring of a BAW resonator;

FIG. 5 is a schematic section of a structured component; and,

FIG. 6 is a schematic section of a component embodied as a multilayer piezo-actuator.

DETAILED DESCRIPTION

Figure 1:
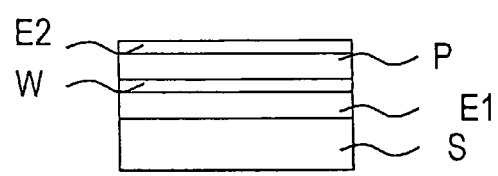
FIG. 1 is a schematic section of a layer structure.

FIG. 1 illustrates a layer structure with a substrate S, a first electrode layer E1, a growth layer W that is structured thin relative thereto, a piezoelectric layer P, and a second electrode layer E2 thereover. The first and second electrode layers E1, E2 can represent individual layers or a multilayer system. Diffusion-reducing and/or hard layers can be integrated into the multilayer system in order improve the power tolerance of the electrode layer. A primer or adapting layer, preferably a thin titanium layer, can be present between the first electrode layer E1 and the substrate or between the substrate and the lower-most layer of a multilayer structure that realizes the electrode layer E1.

The growth layer W is relatively thin and has, for instance, a thickness of 100 nm or less. In comparison thereto, the first electrode layer E1 has a total thickness of approx. 200 to 500 nm. The precise thickness depends on the component type, however. In a BAW resonator, the thickness of the electrode layer is involved in the dimensions of the total layer thickness required for the resonance frequency and therefore cannot be selected freely. In other components, the thickness of the electrode layer can be selected exclusively as a function of the desired current carrying capacity.

The piezoelectric layer P can comprise any desired piezoelectric materials that can be grown in an oriented manner. The layer thickness is determined as a function of the component type; for instance, that in a piezo-actuator is determined depending on the voltage applied, in a BAW resonator depending on the desired resonance frequency. In the latter case, the piezoelectric layer P has a thickness that is approximately equal to one-half wavelength of the acoustic wave that can be propagated in the BAW resonator.

The material selection for the second electrode layer E2 is less critical than that for the first electrode layer E1, since no additional layers, and in particular no additional oriented layers, have to be deposited over this layer.

Figure 2:
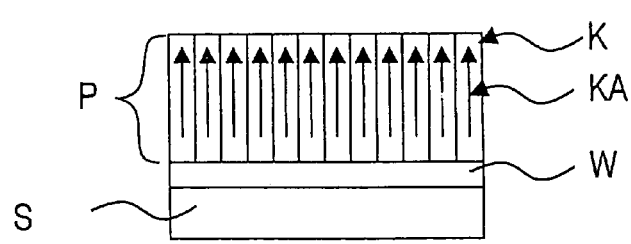
FIG. 2 is a detailed depiction of the orientation of the crystallite in the piezoelectric layer.

Using an enlarged detailed depiction, FIG. 2 illustrates a section of a layer structure. Illustrated purely schematically in the piezeoelectric layer P are individual crystals K that have grown parallel over the growth layer W. In this manner, the crystal axes KA are oriented parallel to one another and parallel to the normal over the growth layer W. If this crystal axis KA matches the piezoelectric axis, a maximum piezoelectric deflection can be attained with the component described herein. In such an orientation the piezoelectric coupling is also maximal.

Figure 3A:
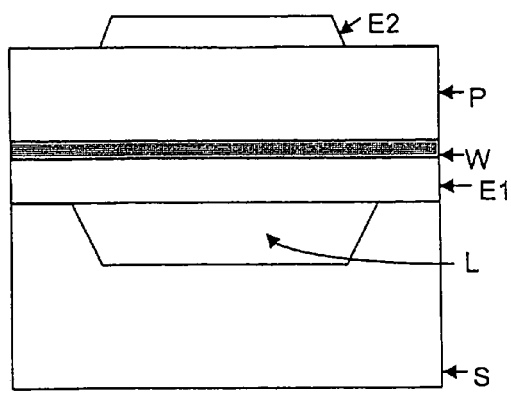
FIG. 3 illustrates two possible embodiments for a BAW resonator.

FIG. 3 illustrates two different BAW resonators, known per se, that can be improved. FIG. 3a illustrates a BAW resonator with membrane technology that in principle has the structure illustrated in FIG. 1. In the active resonator region, which corresponds to the overlap of the electrodes E1 and E2, an air gap L is provided between the substrate and first electrode layer E1, in contrast to FIG. 1. What this leads to is that, based on the great difference in impedance between the electrode material of the first electrode layer E1 and air, there is a high increase in impedance that leads to the reflection of the acoustic wave at the corresponding surface area of the first electrode layer E1. The air gap L can be produced prior to or after the construction of the layer system required for the component.

Figure 3B:
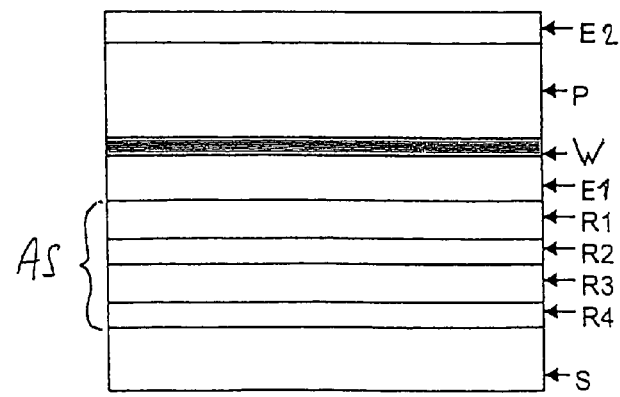

FIG. 3b illustrates a BAW resonator with mirror technology in which an acoustic mirror AS is provided between substrate S and first electrode layer E1. It encompasses an alternating sequence of layers with alternating high and low impedance. In FIG. 3b, four acoustic mirror layers R1, R2, R3, and R4 are illustrated, whereby mirror layers with low impedance comprise for instance $SiO_2$, layers with high impedance on the other hand comprise metal, in particular heavy metal such as Mo or W, or even non-metal layers such as e.g. aluminum nitride, silicon carbide, or diamond. The thickness of the mirror layers is adjusted to approximately one quarter of the wavelength for the resonance frequency of the BAW resonator. However, it is also possible to realize the component with a number of mirror layers that is different and even uneven, whereby the material selection can be made exclusively as a function of the impedance of the material.

FIG. 4A illustrates an exemplary structuring for the individual layers in BAW resonators. The first electrode layer E1 is applied to the entire surface area and then structured such that an electrode region E11 and a connection region E12 occur. The growth layer W is applied with a surface area over the electrode region E11 and then is structured, preferably wet-chemically, such that it has a smaller surface area than the electrode region E11. The edges of the growth layer W are distanced on all sides from the edges of the electrode region E11.

The piezoelectric layer P is applied with a surface area and then structured such that it completely covers the growth layer W, overlaps its edges on all sides, and encloses it directly with the electrode region E11. In addition, the piezoelectric layer can also overlap the edges of the electrode region. In the next step the second electrode layer E2 is applied and structured such that a second electrode region E21 and a second electrode connection surface E22 are formed. The second electrode region E21 is preferably covered with the surface of the growth layer W, is centered thereon, and even more advantageously has a smaller surface area than the growth layer.

FIG. 4C illustrates the layer structure using a schematic section along the sectional line X depicted in FIG. 4A. It is easy to see that the growth layer W is completely embedded in the piezoelectric layer W. The first connection region E12 of the first electrode layer is exposed, as is a connection region E22 of the second electrode layer.

FIG. 4B illustrates a section through the structure along the sectional line Y depicted in FIG. 4A. In this section, as well, it is easy to see the complete encapsulation of the growth layer W within the piezoelectric layer P. It can also be seen that the surface of the second electrode layer E2 approximately matches that of the growth layer W.

FIG. 5 is a schematic section of a component constructed as a BAW resonator with mirror technology. Here it is easy to see that some of the mirror layers R1 through R4 are structured. In particular, the mirror layers are structured with high impedance since they usually comprise metal. The usually electrically insulating layers of low impedance, in this case layers R1 and R3, are applied with the entire surface and remain unstructured, thereby encapsulating the mirror layers with high impedance R2 and R4. The rest of the structure of the component corresponds to that illustrated in FIG. 4.

In one embodiment of BAW resonator, a silicon wafer with <100> orientation acts as substrate S. On the surface, the latter is covered with an oxide layer O that is made of $SiO_2$ and that is approx. 530 nm thick. A high impedance layer made of tungsten, with a thickness of approx. 760 nm, acts as the lower-most mirror layer R4. Applied thereover is a mirror layer R3 with low impedance, in this case an $SiO_2$ layer with a thickness of 675 nm. Thereover follows the mirror layer R2, which corresponds in terms of material and layer thickness to the mirror layer R4. The upper-most mirror layer is another $SiO_2$ layer R1 that has a thickness of approx. 675 nm. An aluminum layer with a suitable thickness is used as first electrode layer E1. Sputtered thereover as growth layer W is a layer of molybdenum, for instance in a layer thickness of 80 nm. Applied thereover is the piezoelectric layer P, for instance an aluminum nitride layer in a thickness of approx. 2400 nm. Then a second electrode layer E2 is applied (not shown in the figure), for instance made of an aluminum/copper alloy.

FIG. 6 is a schematic section of a component embodied as a multilayer piezo-actuator. In contrast to the general layer structure in accordance with FIG. 1, in this component electrode layers E and piezoelectric layers P alternate, whereby a growth layer W1 through W4 is provided beneath each piezoelectric layer P1 through P4. This actuator is also constructed with thin-layer technology, whereby the deposition conditions for the piezoelectric layer occur such that oriented growth occurs and thus a highly oriented crystalline piezoelectric layer is obtained. A multilayer piezo-actuator embodied in this manner in a thin-layer structure can include any desired number of piezoelectric layers including associated electrode layers. The limiting factor is always the quality of the growing layers.

The structuring of the individual layers of the piezo-actuator occurs such that the growth layer is encapsulated as usual by the piezoelectric layer P. The electrode layers E1, E2, and the additional electrode layers E3, E4, etc. located thereover are structured such that they can be connected alternatively to different external electrodes and thus to different potentials. This results in parallel circuitry of all individual actuators that each comprise two electrodes and a piezoelectric layer located therebetween.

Not explained in greater detail are components that have piezoelectric functional layers and that are embodied as sensors. These react to an external physical effect such as for instance pressure, temperature, acceleration, bending, or the effect of a chemical, whereby the piezoelectrically produced voltage can be measured as a variable. While given an increase in temperature or given the effect of a force the piezoelectric effect can be used directly on the piezoelectric layer, when a chemo-sensor is used this must generally be supported with an auxiliary layer that during the effect of a chemical changes its properties such that it acts on the piezoelectric effect. Such components are known per se, can have different embodiments, and therefore do not have to be explained in greater detail here. What is decisive is that in these components that have a piezoelectric (functional) layer and that are embodied as sensors, as well, the quality of the piezoelectric layer and thus the sensitivity of the sensor is increased by virtue of the features described herein.

Although the invention was explained using only a few exemplary embodiments, it is not limited to these. In addition to the explicitly illustrated designs, additional variations are conceivable, in particular with respect to the structuring of the individual layers, with respect to the selection of material, layer thicknesses, dimensioning, and with respect to the provision of additional layers.

The invention claimed is:

1. An electrical component comprising:
   a substrate;
   a first electrode layer;
   a growth layer that is structured and that is thinner than the first electrode layer;
   a piezoelectric layer; and
   a second electrode layer,
   wherein the growth layer is on the first electrode layer, the growth layer is structured relative to the first electrode layer, and the growth layer has a smaller surface area than the first electrode layer.

2. An electrical component comprising:
   a substrate;
   a first electrode layer;
   a growth layer that is structured and that is thinner than the first electrode layer;
   a piezoelectric layer; and
   a second electrode layer,
   wherein the piezoelectric layer (i) substantially covers the growth layer and (ii) overlaps the growth layer along a perimeter of the growth layer, thereby causing the piezoelectric layer and the first electrode layer to substantially enclose the growth layer.

3. The electrical component of claim 1, wherein the first electrode layer comprises multiple layers, the multiple layers comprising a titanium layer and another layer that is not titanium.

4. An electrical component comprising:
   a substrate;
   a first electrode layer;
   a growth layer that is structured and that is thinner than the first electrode layer;
   a piezoelectric layer;
   a second electrode layer; and
   an acoustic mirror between the substrate and the first electrode layer.

5. The electrical component of claim 4, wherein the growth layer supports ordered growth relative to the piezoelectric layer.

6. The electrical component of claim 4, wherein the growth layer comprises at least one of the following: Au, Mo, W, Pt, $Si_3N_4$, sapphire, spinel, Si, $Ba_3TiO_3$, $ZrO_2$, MgO, and $TiO_2$.

7. The electrical component of claim 4, wherein the piezoelectric layer comprises at least one of AlN and ZnO.

8. An electrical component comprising:
   a substrate;
   a first electrode layer;
   a growth layer that is structured and that is thinner than the first electrode layer;
   a piezoelectric layer;
   a second electrode layer;
   a multilayer structure comprising a plurality of piezoelectric layers; and
   an additional electrode layer and an additional growth layer between pairs of the plurality of piezoelectric layers.

9. A piezoelectric actuator comprising the electrical component of claim 8.

10. A bulk acoustic wave resonator comprising:
    the electrical component of claim 4.

11. The electrical component of claim 1, wherein the piezoelectric layer (i) substantially covers the growth layer and (ii) overlaps the growth layer along a perimeter of the growth layer, thereby causing the piezoelectric layer and the first electrode layer to substantially enclose the growth layer.

12. The electrical component of claim 1, wherein the growth layer supports ordered growth relative to the piezoelectric layer.

13. The electrical component of claim 1, wherein the growth layer comprises at least one of the following: Au, Mo, W, Pt, $Si_3N_4$, sapphire, spinel, Si, $Ba_3TiO_3$, $ZrO_2$, MgO, and $TiO_2$.

14. The electrical component of claim 1, wherein the piezoelectric layer comprises at least one of AlN and ZnO.

15. The electrical component of claim 1, wherein the first electrode layer comprises multiple layers, the multiple layers comprising a titanium layer and another layer that is not titanium.

16. The electrical component of claim 4, wherein the first electrode layer comprises multiple layers, the multiple layers comprising a titanium layer and another layer that is not titanium.

* * * * *

UNITED STATES PATENT AND TRADEMARK OFFICE
CERTIFICATE OF CORRECTION

PATENT NO. : 7,489,067 B2 Page 1 of 1
APPLICATION NO. : 10/552927
DATED : February 10, 2009
INVENTOR(S) : Thomas Metzger It is certified that error appears in the above-identified patent and that said Letters Patent is hereby corrected as shown below:

Col. 9, Claim 14, line 2, delete "AIN" and insert -- A1N --.

Signed and Sealed this

Seventh Day of April, 2009

JOHN DOLL
*Acting Director of the United States Patent and Trademark Office*